United States Patent [19]

Evans et al.

[11] Patent Number: 5,632,434

[45] Date of Patent: May 27, 1997

[54] PRESSURE ACTIVATED DIAPHRAGM BONDER

[75] Inventors: Leland B. Evans, Antioch; Vincent Malba, Livermore, both of Calif.

[73] Assignee: Regents of the University of California, Oakland, Calif.

[21] Appl. No.: 496,587

[22] Filed: Jun. 29, 1995

[51] Int. Cl.⁶ .................................................. B23K 37/04
[52] U.S. Cl. .................... 229/44.7; 228/44.3; 228/49.5; 228/235.1; 156/583.1
[58] Field of Search .......................... 228/44.7, 44.3, 228/235.1, 49.5; 156/583.1, 583.3

[56] References Cited

U.S. PATENT DOCUMENTS

| | | | |
|---|---|---|---|
| 2,524,932 | 10/1950 | Schluman | 156/583.1 |
| 3,516,155 | 6/1970 | Smith | 29/626 |
| 3,670,396 | 6/1972 | Lindberg | 29/471.3 |
| 3,699,640 | 10/1972 | Cranston et al. | 29/471.1 |
| 4,010,885 | 3/1977 | Keizer et al. | 228/6 A |
| 4,159,921 | 7/1979 | Inohara et al. | 156/272 |
| 4,184,623 | 1/1980 | Strasser | 228/180 A |
| 4,573,627 | 3/1986 | Miller et al. | 228/44.7 |
| 4,607,779 | 8/1986 | Burns | 228/106 |
| 4,903,885 | 2/1990 | Schwarzbauer | 228/106 |
| 4,903,886 | 2/1990 | Schwarzbauer | 228/106 |
| 5,058,796 | 10/1991 | Schwarzbauer | 228/44.3 |
| 5,067,647 | 11/1991 | Schwarzbauer | 228/5.5 |
| 5,158,226 | 10/1992 | Schwarzbauer | 228/106 |
| 5,222,648 | 6/1993 | Takano | 228/5.5 |
| 5,365,656 | 11/1994 | Dahringer et al. | 29/840 |

FOREIGN PATENT DOCUMENTS 577590  10/1977  U.S.S.R. .................. 228/44.7

OTHER PUBLICATIONS

"Vacuum Bond Fixture," *IBM Tech. Discl. Bull.*, vol. 35, No. 3 (Aug. 1992) p. 444.

*Primary Examiner*—P. Austin Bradley
*Assistant Examiner*—Jeffrey T. Knapp
*Attorney, Agent, or Firm*—Henry P. Sartorio; L. E. Carnahan

[57] ABSTRACT

A device is available for bonding one component to another, particularly for bonding electronic components of integrated circuits, such as chips, to a substrate. The bonder device in one embodiment includes a bottom metal block having a machined opening wherein a substrate is located, a template having machined openings which match solder patterns on the substrate, a thin diaphragm placed over the template after the chips have been positioned in the openings therein, and a top metal block positioned over the diaphragm and secured to the bottom block, with the diaphragm retained therebetween. The top block includes a countersink portion which extends over at least the area of the template and an opening through which a high pressure inert gas is supplied to exert uniform pressure distribution over the diaphragm to keep the chips in place during soldering. A heating means is provided to melt the solder patterns on the substrate and thereby solder the chips thereto.

28 Claims, 3 Drawing Sheets

PRESSURE ACTIVATED DIAPHRAGM BONDER

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to bonding apparatus, particularly to bonders for electronic components, and more particularly to a pressure activated diaphragm bonder for bonding chips to a substrate.

Since the initial development of integrated circuits, substantial efforts have been directed to the development of processes and apparatus for attaching components to a support substrate and interconnecting the various components. This has been accomplished by various techniques involving gluing, soldering, compression, anodic bonding, etc., each of these techniques being generally referred to as "bonding". These prior efforts are exemplified by U.S. Pat. No. 3,516,155 issued Jun. 23, 1970 to C. W. Smith; U.S. Pat. No. 3,699,640 issued Oct. 24, 1972 to B. H. Cranston et al; U.S. Pat. No. 4,184,623 issued Jan. 22, 1980 to B. Strasser; U.S. Pat. No. 4,607,779 issued Aug. 26, 1986 to C. D. Burns; U.S. Pat. No. 4,903,885 issued Feb. 27, 1990 to H. Schwarzbauer; U.S. Pat. No. 5,158,226 issued Oct. 27, 1992 to H. Schwarzbauer; U.S. Pat. No. 5,222,648 issued Jun. 29, 1993 to T. Takano; and U.S. Pat. No. 5,365,656 issued Nov. 22, 1994 to D. W. Dahringer et al.

With the development of high density, high performance integrated circuits, both the effectiveness of the attaching techniques and the related costs have lead to substantial efforts in packaging techniques. High density, high performance packaging of integrated circuit chips can be accomplished by attaching bare chips to a substrate and interconnecting them to form a multichip module or hybrid package. Attachment of chips to substrates on multichip modules and hybrid packages is generally accomplished with adhesives (epoxies, polyimides), hard solders (AuSi, AuSn) or flip-chip solder bumps (PbSn). Hard solders offer considerable thermal, mechanical, and electrical advantages over adhesives and flip-chip processes. Hard solders can be thick or thin film. Thick film solders are preformed into sheets which are placed between the chip (die) and the substrate, while thin films are deposited by evaporation or sputtering solder onto the backside of the chip or die, onto substrate, or onto both.

In both the thick and thin film solder approaches, the temperature is raised above the melting point of the solder, and held there until melting has occurred. The die or chip is held in position, and pressure is exerted on the chip during melting. High pressure generally results in better, void-free bonds, because the oxide layer on the solder is more readily fractured, allowing a flow of solder to occur.

Typical prior methods for holding the chips and applying pressure include a spring-loaded block arrangement and a robotic pick-and-place handler. The spring-loaded block arrangement is problematic from a chipping and uniformity point of view, while the robotic pick-and-place method does not allow sufficiently high pressure to be applied, and is difficult and expensive to configure in an inert atmosphere or vacuum environment.

The present invention overcomes the above-referenced problems by providing a chip-to-substrate bonder that utilizes thin film eutectic solders, a template to accurately position the chips on the substrate, and a pressure activated diaphragm for applying uniform high pressure to the chips during melting of the solder by a heating means, without causing chipping or cracking thereof. Thick film preforms would also work with this bonder. The bonder of this invention also enables simultaneous attachment of different size chips to the substrate.

SUMMARY OF THE INVENTION

It is an object of the present invention to provide a bonder for attaching integrated circuit chips to a substrate.

A further object of the invention is to provide a pressure activated bonder to attach one component to another without damage to either component.

A further object of the invention is to provide a bonder capable of bonding in the presence of any gas, or under vacuum.

A further object of the invention is to provide a pressure activated apparatus capable of simultaneously attaching different size chips to a substrate.

Another object of the invention is to provide a pressure activated diaphragm bonder which utilizes a template to accurately position components on a substrate and applies sufficient pressure to cause fracture of a solder oxide and flow of the solder between the components and substrate.

Another object of the invention is to provide a pressure activated bonder having alignment means for each of the x, y, and theta alignment stages.

Another object of the invention is to provide a device constructed to bond chips to a substrate to form multichip modules or hybrid packages, utilizing thin film eutectic solders or thick films or adhesive materials.

Another object of the invention is to provide a bonder which allows a uniform, high pressure to be applied to chips being soldered to a substrate without causing chipping or cracking of the chips, and the applied pressure is sufficient to break up the oxide layer on the solder allowing the solder to flow.

Other objects and advantages of the present invention will become apparent from the following description and accompanying drawing. The invention involves a pressure activated apparatus constructed to bond integrated circuit chips (e.g., silicon, gallium arsenide, indium phosphide) to a substrate (e.g., silicon, alumina, aluminum nitride, metal) to form multichip modules or hybrid packages, utilizing thin film eutectic solders (e.g., gold-silicon, gold-tin) or bonding materials (e.g., thermoplastic dry film, thick film hard solders, soft solders, or gold-to-gold for compression bonding). The bonder apparatus utilizes a diaphragm which allows a uniform, high pressure to be applied to the chips without causing chipping or cracking thereof while fracturing any solder oxide and providing solder flow. The bonder also utilizes a template which provides highly accurate chip placement on the substrate, and can simultaneously bond chips of different sizes and thicknesses. The bonder is also provided with means which enable bonding in the presence of any gas (nitrogen, helium, forming gas), or under vacuum, thus enabling a controlled environmental operation.

The pressure actuated diaphragm bonder while specifically described hereinafter for bonding chips to a substrate, can be utilized for bonding various components together, such as heat sinks to laser diodes, microchannel heat sinks to modules, multichip module or hybrid packaging, or any two flat or matching surfaces. Thus, the present invention has a variety of bonding applications by the use of uniform high pressure and which can be carried out under vacuum conditions or in the presence of any gas.

BRIEF DESCRIPTION OF THE DRAWINGS

The accompanying drawings, which are incorporated into and forms a part of the disclosure, illustrate embodiments of the invention and, together with the description, serves to explain the principles of the invention.

DETAILED DESCRIPTION OF THE INVENTION

The present invention is a pressure activated diaphragm bonding apparatus, particularly applicable for bonding multiple integrated circuit chips to a substrate, but which can be utilized for bonding any two matching surfaces together. This is accomplished by the utilization of a template for accurately positioning the chips on a substrate and uniformly applying high pressure to the diaphragm to enable bonding of chips of different size and thickness at the same time. The high pressure and the template enable bonding, such as by solder, so as to retain the chips until the solder is melted by a heating means, such as a hot plate, resistance heating, or oven, associated with the bonding apparatus and serving to increase solder flow by breakup of the solder oxide layer. The bonding apparatus is also provided with means whereby the bonding of chip or die to substrate can be carried out in the presence of any gas or under vacuum.

Figure 1:
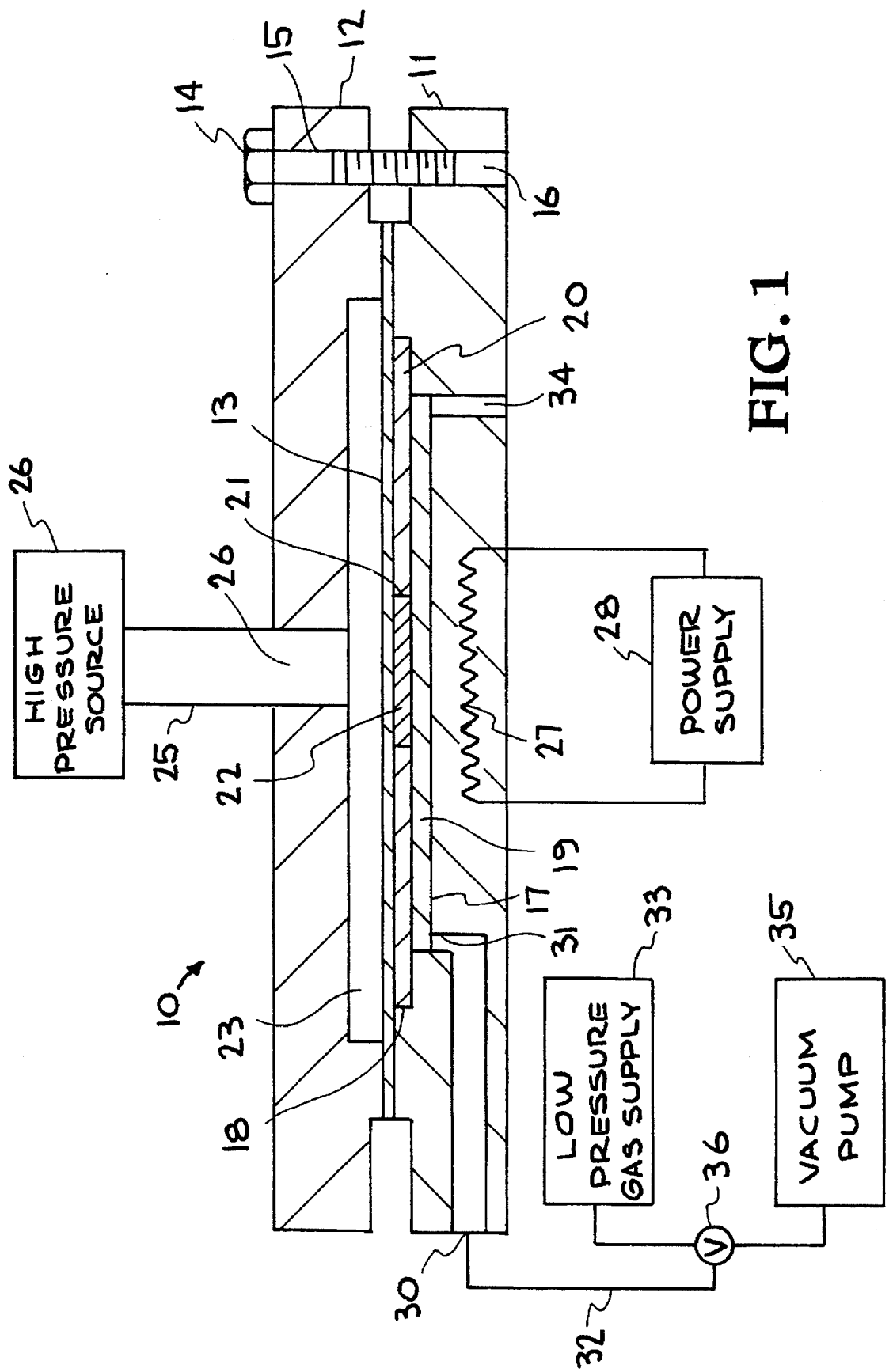
FIG. 1 illustrates in cross-section an embodiment of the pressure activated diaphragm bonder of the present invention.

Referring now to the embodiment of FIG. 1, the bonder, generally indicated at 10, consists of two metal members or blocks, bottom block 11 and a top block 12 between which is secured a thin diaphragm 13. While not shown, an O-ring or other type seal may be located adjacent bolts 14 between blocks 11 and 12. The members or blocks 11 and 12, during bonding operation are secured together, for example, by a plurality of screws or bolts 14. Bolt 14, extends through an aperture 15 in upper block 12 and is threadly inserted into a threaded aperture 16 in bottom block 11. The metal blocks 11 and 12 may be constructed, for example, of aluminum, stainless steel, or other suitable metal. An alignment mechanism to assure alignment of the substrate with the chip has been omitted from FIG. 1, but illustrated in FIG. 2.

Bottom block 11 is provided with a pair of machined areas or counter-sinks 17 and 18, which counter-sink 18 being larger than counter-sink 17. A substrate 19 (e.g., silicon, alumina, aluminum nitride, metal, etc.) is positioned in counter-sink 17. A thin metal template 20, constructed of aluminum, stainless steel, molybdenum, or copper, having a thickness of 0.020 to 0.050 inch, is provided with a plurality of openings 21, only one shown, and is positioned in countersink 18. Counter-sinks 17 and 18 define substrate and template retaining areas or sections. Integrated circuit chips 22, only one shown, are positioned in the openings 21 in template 20. The template 20 has a thickness which is slightly thinner than the thickness of the chips 22 to be bonded to the substrate 19, and fits tightly into the counter-sink 18. The openings 21 of template 20 are machined to the size of the chips 22 to be inserted therein and are in exact locations with respect to patterned solder, not shown, or substrate 19. The substrate 19 can be moved with respect to the template 20 with positioners, not shown. When the alignment between the substrate 19 and the template 20 is achieved, the chips 22 are placed in the correct openings 21 in the template. The openings 21 and chips 22 may be of different cross-sections or size, and the chips 22 may be of different thickness or heights. Also, while not shown, a thermocouple assembly may be utilized to determine the temperature of diaphragm 13. Such may be installed through an opening in upper or top block or member 12 and extend into the counter-sink 23 of top member 12.

In actual operation, the thin diaphragm 13 (0.001–0.005 inch of aluminum, copper, gold, Kapton, etc., or combinations of more than one material) is placed over the template 20 with the chips 22 in position and secured between blocks 11 and 12 by bolts 14. Top block 12 is provided with a machined area or counter-sink 23 and a port or opening 24 which is connected to a gas lead conduit or tube 25 which extends to a high pressure gas source 26, having controls, not shown. Counter-sink 23 is larger than counter-sink 18 in bottom block 11, and port or opening 24 is preferably located in the center of counter-sink 23. The gas of high pressure source 26 may be composed of nitrogen, helium, argon, air, etc., with a pressure of 60–120 psi, and is supplied through port 24 and counter-sink 23 and exerts a force on diaphragm 13. The diaphragm 13 transfers this force uniformly to the chips 22 over the entire surface of substrate 19. The applied force on diaphragm 13 is maintained while the patterned solder on substrate 19 is melted by heating means, exemplified by a resistance element 27 and power supply 28. The heating should be to an equilibrium temperature of the overall material. The heating means may be of any type utilized in integrated circuit fabrication, such as a hot plate, resistance heater, or an oven. The heating can be accomplished by a heater located external to the bonder 10. The high pressure from source 26 is maintained on diaphragm 13 and chips 22 to ensure that the patterned solder be heated to its melting point, and held at that temperature for a length of time (1–30 mins, for example) depending on the process conditions. The patterned solder may, for example, be composed of gold/silicon or gold/tin, which is deposited on patterned areas of the substrate by sputter deposition or evaporation. While heating in an oven provides highly uniform and rapid heating, and is thus preferred, such requires feed-throughs for gas leads. A hot plate or the resistance type heater is simple, fast, economical, and has been routinely successful. The bottom block or member 11 of bonder apparatus, as shown in FIG. 1, may be constructed of a plurality of plates with some plates having open areas therein, which when secured together, as by bolts 14, the open areas in the plate define the counter-sinks or retaining sections 17 and 18. Top block 12 could also be constructed of two plates, one having port 28 therein and the other having an opening which functions as the counter-sink 23.

The bonder apparatus is also provided with means for controlling the environment during bonding. The bottom block 11 is provided with a pair of interconnected ports, passageways or holes 30 and 31, with passageway 31 being smaller than passageway 30 and terminating at the edge of countersink 17 in which substrate 19 is positioned. A gas lead, conduit or tube 32 connects passageway 30 in block 11 with a low pressure gas supply 33. The low pressure (0.1 to 10 psi) gas may be an inert or reducing gas (nitrogen, helium, argon, forming gas, hydrogen, etc.), and can be utilized to provide a desired inert or reducing atmosphere, as known in the art. A vent hole 34 is provided in bottom block 11 adjacent an opposite edge of counter-sink 17 to provide exit for the low pressure gas, and prevents pressure buildup in the bottom block. Alternately, the vent hole 34 can be stoppered, and the bottom block 11 can be evacuated to allow chip or die bonding under vacuum. This is accomplished by connecting the passageway 30 in bottom block 11 to an appropriate vacuum assembly or pump, generally indicated at 35, via a control value arrangement 36. Also, while solder has been exemplified as the bonding material, other types of bonding can be carried with the bonder. In addition, the solder could be predeposited on the chips instead of on the substrate. Preferably, the solder should be on both the chip and the substrate, to ensure better bonding when heated.

Figure 2:
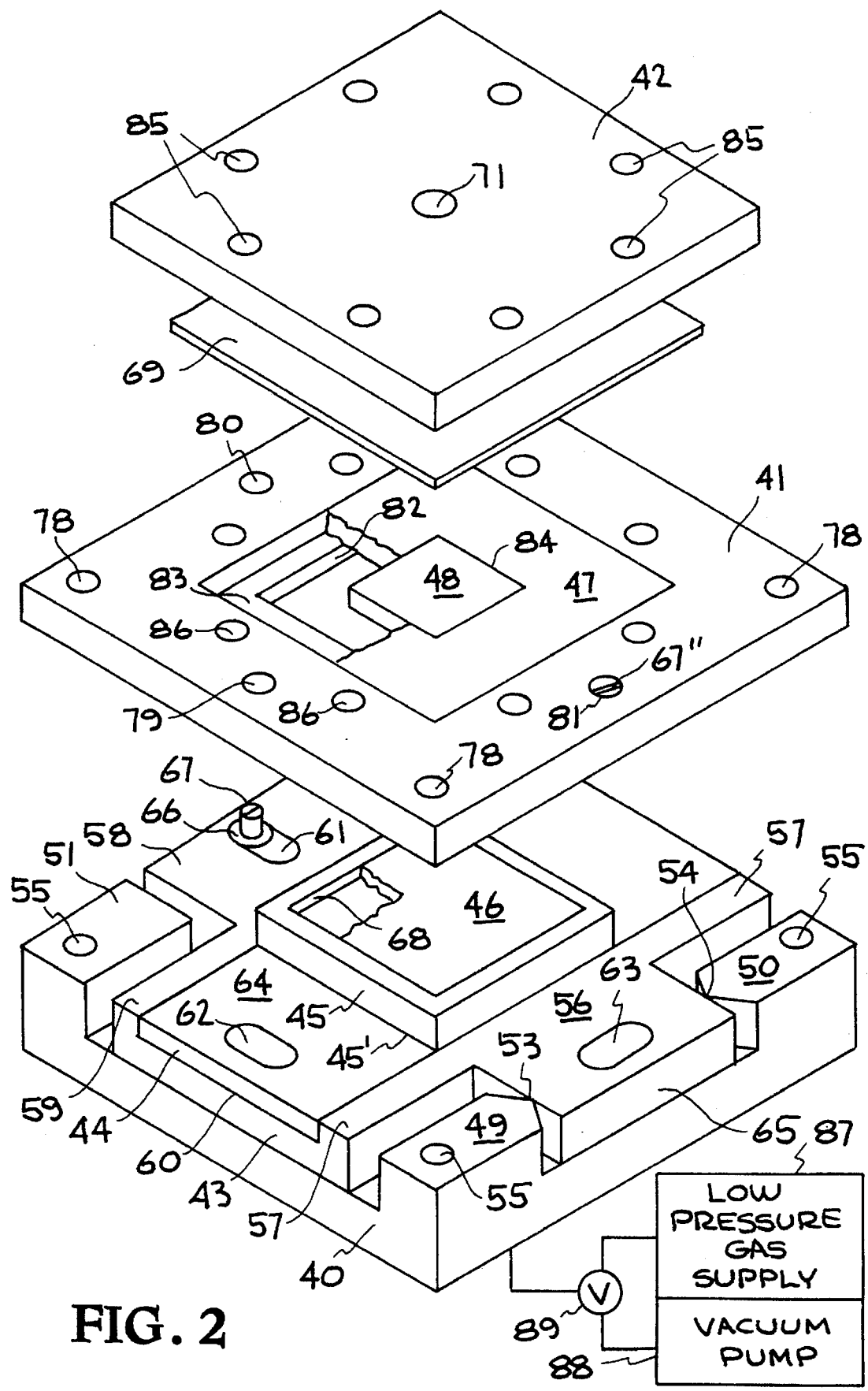
FIG. 2 is partial exploded perspective view of another embodiment of the invention.
Figure 3A:
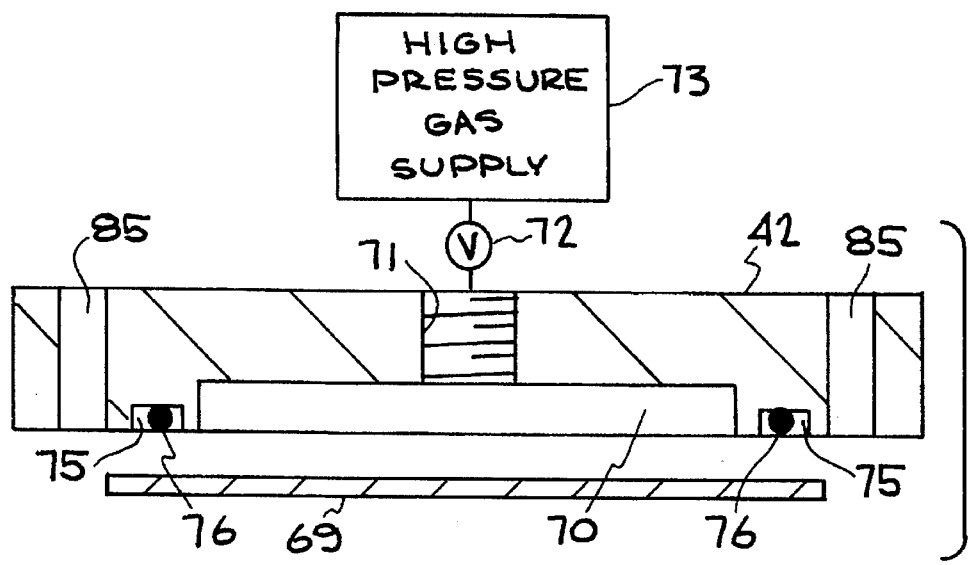
FIG. 3A is an exploded cross-section of the top plate and a diaphragm of the FIG. 2 embodiment.
Figure 3B:
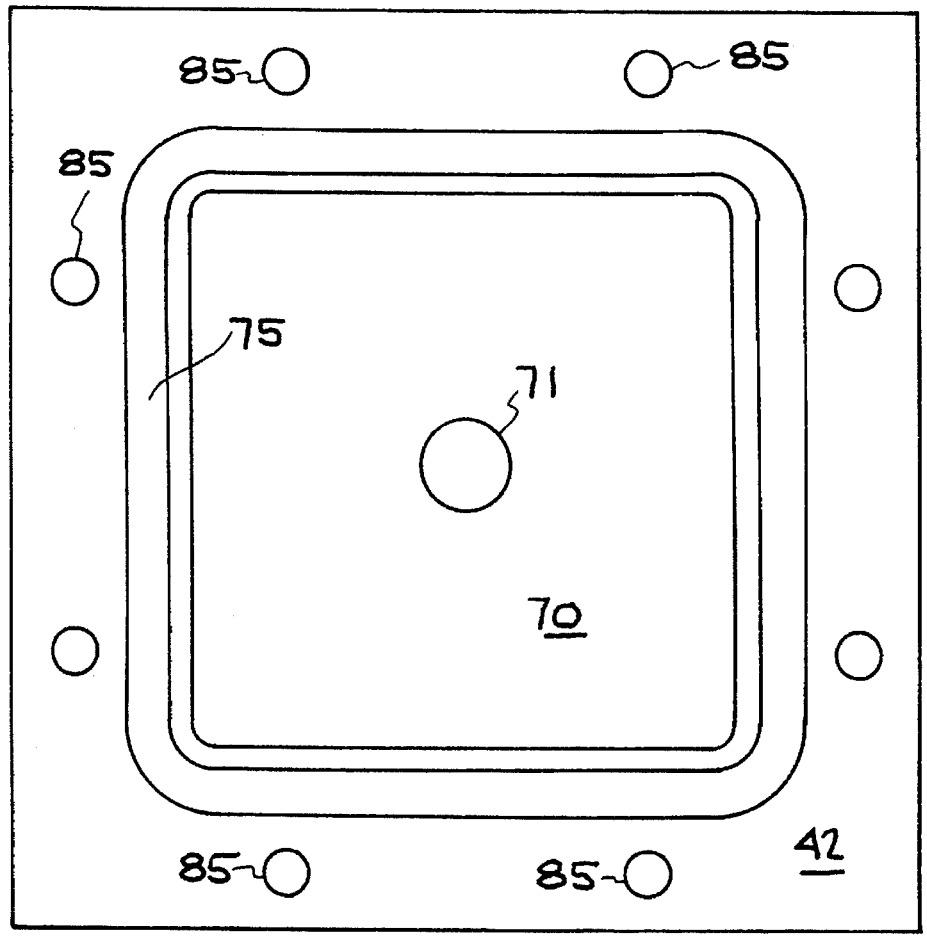
FIG. 3B is a bottom view of the top plate of FIG. 3A.

The embodiment of FIGS. 2 and 3A–3B differs from that of FIG. 1 in that it is constructed from a plurality of plates having openings therein which function as the countersink areas of FIG. 1. Also, FIG. 2 illustrates the x, y, and theta alignment stages or planes omitted from FIG. 1. The various components of FIG. 2 and FIG. 3A are aligned as indicated by a dash-dot line and arrows extending through the central area of the components.

FIGS. 2 and 3A–3B illustrate a bonder apparatus having a bottom member, block or base assembly 40, alignment plate assembly or member 41, a top plate assembly or member 42 (see FIG. 3A), a substrate retainer assembly 43 is located on base assembly 40, in which is positioned a y-axis plate 44, and on top of which is located a retainer plate 45. As described hereinafter a substrate 46 is adapted to be positioned in retainer plate 45, and a template 47 is positioned on alignment plate assembly 41, with a chip or die 48 adapted to be positioned in an opening in template 47, as shown in FIG. 2.

The bottom member or base assembly 40 includes four (4) raised corner sections 49, 50, 51, and 52, with corner sections 49 and 50 being of rectangular configuration, with each having a pointed or tapered portion or section 53 and 54, respectively, while corner sections 51 and 52 have a square configuration. Each of the corner sections includes an opening or aperture 55 into which screws, not shown, are inserted and by which alignment plate assembly 42 is secured to base assembly 40.

Substrate retainer assembly 43 includes four (4) outwardly extending sections 56, 57, 58, and 59, with a channel or groove 60 extending from an outer end of section 57 to an outer end of section 59 and in which is positioned the y-axis plate 44. The sections 56–59 of assembly 43 extend between corner sections 49–50, 50–52, 52–51, and 51–49, respectively, with each section 57–59 having a space between their adjacent corner sections, but with section 56 being closely adjacent the pointed portions 53 and 54 of corner sections 49 and 50. Section 58 constitutes an x-axis or stage with section 58 having a slot 61 therein for movement or adjustment of the x-axis or stage.

The y-axis plate 44 is located in the channel or groove 60 of retainer assembly 43, and in the center of which is located an opening 45' in which is positioned the retainer plate 45. Retainer plate 45 may be secured to plate 44 by welding, thus eliminating the opening 45'; or plates 45 and 44 may be machined as a single piece. Plate 44 includes a slot 62 for movement or adjustment of the y-axis or stage 64, and retainer assembly 43 in section 56 thereof includes a slot 63 for movement of theta-axis or stage 65. A cam adjuster 66 having a head 67 is adapted to be positioned in each of slots 61, 62, and 63, only one cam adjuster being illustrated for insertion into slot 62, as indicated by the dash-dot line. Movement of the cam adjuster 66 in slot 62, for example, moves the plate 44 for y-axis adjustment, as described hereinafter. Similarly movement of the cam adjuster in slots 61 and 63 cause movements in the theta-axis.

Retainer plate 45 includes a rim or groove 68 in which substrate 46 is adapted to be positioned. As seen in FIG. 3A, top plate 42 includes a machined area or counter-sink 70 which aligns with opening 68 of retainer plate 45, and a central opening or passageway 71 by which area 70 is placed in fluid communication via a valve 72 to a high pressure fluid or gas supply 73. Thus, gas under pressure can be directed via valve 72, central opening 71, counter-sink 70 to the underside of a diaphragm 69 (see FIG. 3A). A groove 75 is located outwardly from counter-sink 70 and in which a seal 76, such as an O-ring, copper ring, etc. is adapted to be positioned to prevent leakage of high pressure gas from counter-sink 70 when top plate 42 is secured to alignment plate 41.

The alignment plate assembly 41, is provided in the corners thereof with four (4) threaded openings or apertures 78 which align with apertures 55 in base assembly 40, and through which screws or bolts or other means extend into for securing plate assembly 41 to base assembly 40. Plate assembly 41 is provided with three (3) openings or apertures 79, 80, and 81 through which heads indicated at 67, 67', and 67" of cam adjusters 66 extend. Plate assembly 41 is also provided with a central opening 82, of a square configuration in this embodiment, and a machined ridge area or counter-sink 83 extending around central opening 82. Central opening 82 is of a cross-section slightly larger than retainer plate 45. If desired, plate assembly 41 can be constructed of two plates, one including central opening 82 and the other including an opening which replaces counter-sink 83. Template 47 is adapted to be positioned in counter-sink 83 of plate assembly 41 and is designed for a snug fit therein. Template 47 is provided with at least one opening 84 in which a chip 48 to be bonded to substrate 46 is adapted to be positioned. The template 47 may include a number of openings (84) of the same or different configurations in which chips (48) of various cross-sections may be positioned. The configuration of the openings (84) in template 47 must correspond to the configuration of the chips (48) to be located therein to assure proper positioning and alignment on substrate 46. As in the FIG. 1 embodiment, chips of various heights may be bonded to the substrate, but the template 47 should be thinner than the thinnest chip positioned therein.

Top plate assembly or member 42 (FIGS. 3A and 3B) is provided with a plurality of openings or holes 85 (eight shown) which align with threaded openings or holes 86 in plate assembly 41, and by which screws or bolts, not shown, secure top plate 42 to plate assembly 41 such that diaphragm 69 is secured there between, with the seal 76 preventing leakage between the diaphragm 69 and top plate 42. The diaphragm 69, when plates 41 and 42 are secured together, is positioned on template 47 and chip 48 whereby fluid under pressure from gas supply 73 forces the diaphragm 69 against template 47 and chip 48 during bonding of chip 48 to substrate 46. As in the FIG. 1 embodiment, the base plate 40 is connected to a low pressure gas supply 87 or a vacuum pump 88 via a valve 89.

In operation with base assembly 40 and alignment plate assembly 41 bolted together, such that retainer plate 45 extends into opening 82 in plate 41, a substrate 46 is positioned in groove 68 of retainer plate 45. The substrate 46 is aligned in the bonder by movement of the x-axis, y-axis, and theta-axis cam adjusters 66 via turning of the cam adjuster heads 67, 67', and 67", which includes slots into which a tool, such as a screwdriver, fits. Thus, merely turning the head 67, 67' or 67" will accurately align the substrate 46, with the template 47, thereby aligning chip 48 with substrate 46. After the chip 48 has been placed in opening 84 of template 47 and aligned with substrate 46, the top plate 42 is secured to plate assembly 41, heat is applied uniformly to chip 48 and substrate 46 so that solder or other bonding material on either or both of these components is heated, while at the same time high pressure gas is directed onto the diaphragm 69 and template 47, as above described. While not shown, the chip 48 is retained against the substrate 46 until the bonding operation is completed. Whereafter the top plate assembly 42 is removed from the alignment plate assembly 41, and then the template 47 and the substrate 46 with the chip 48 bonded thereto is removed from the retainer plate 45. If it is desired to carry out the bonding operation under low pressure or vacuum, the retainer plate 45 is connected via openings, not shown, to gas supply 87 or vacuum pump 88 via valve 89, as in the FIG. 1 embodiment. The heating means, as above described, may be a resistance heater, hot plate, etc. or the bonder can be placed in an oven where appropriate.

It has thus been shown that the pressure activated diaphragm chip or die bonder of the present invention enables effective and accurate bonding of chips to a substrate, while exerting high pressure on the chips to ensure fracture or breakup of any oxide layer on the solder, thus providing effective melting and flow of the solder. Due to the use of the diaphragm, uniform pressure can be applied across the substrate, while enabling the bonding of different thickness or height chips due to the flexibility of the thin diaphragm. The bonder of this invention also enables the bonding of chip-to-substrate to be carried out in any atmosphere or under vacuum conditions. Thus, the present invention provides bonding of chips to substrates for multiple module or hybrid as well as other applications such as bonding microchannel heat sinks to modules, bonding heat sink to laser diodes, or merely bonding any two flat or matching surfaces together.

While specific embodiments of the pressure activated diaphragm bonder have been illustrated and described, and specific materials, parameters, etc. have been described to exemplify and provide a clear understanding of the invention, such are not intended to be limiting. Modifications and changes may become apparent to those skilled in the art, and it is intended that the invention be limited only by the scope of the appended claims.

The invention claimed is:

1. An apparatus for bonding one surface to another, comprising:

a pair of members;

a first of said pair of members having a pair of retaining sections therein, a first of said pair of retaining sections being larger than a second of said pair of retaining sections;

a second of said pair of members having at least one open section therein, said open section in said second of said pair of members being larger than said pair of retaining sections in said first of said pair of members;

a diaphragm positioned intermediate said pair of members, said diaphragm being larger than said open section in said second of said pair of members;

means for removably securing said diaphragm between said pair of members;

a template positioned in said first of said pair of retaining sections in said first of said pair of members, said template being provided with openings each constructed to retain therein an object having an associated surface to be bonded;

said second of said pair of retaining sections in said first of said pair of members being adapted to retain therein an object having an associated surface to be bonded;

means for heating and bonding material located on at least one associated surface to be bonded; and means for applying gas under pressure to said diaphragm for uniformly applying force thereacross and applying force on an associated surface to be bonded.

2. The apparatus of claim 1, wherein said means for applying gas under pressure includes a port in said second of said pair of members, said port being in fluid communication with said open section of said second of said pair of members, and adapted to be operatively connected to a pressurized gas source.

3. The apparatus of claim 1, wherein said template is thinner than an associated object retained in one of said openings therein.

4. The apparatus of claim 1, wherein said diaphragm is flexible, so as to allow for associated objects retained in said template to have different heights.

5. The apparatus of claim 1, wherein said second of said pair of retaining sections in said first of said pair of members contains a substrate, and wherein said template retains at least one chip to be bonded to said substrate.

6. The apparatus of claims 5, wherein one of said substrate and at least one chip is provided with bonding material to be heated by said means for heating.

7. The apparatus of claim 1, additionally including means for placing the second of said pair of retaining sections under an environment selected from the group consisting of controlled atmosphere and vacuum conditions.

8. The apparatus of claim 7, wherein said last mentioned means includes a plurality of passageways in said first of said pair of members, one of said passageways being adapted to be connected to an atmosphere source or a vacuum pump.

9. The apparatus of claim 8, wherein said one of said passageways is connected to a valve, said valve being constructed to interconnect said one of said passageways to a low pressure gas supply or to a vacuum pump.

10. A pressure activated bonder, particularly adapted to bond integrated circuit chips to a substrate, comprising:

a first assembly, a second assembly, a diaphragm removably positioned adjacent said first and said second assemblies, one of said assemblies being constructed to retain therein a substrate, a template adapted to retain at least one chip in contact with said substrate, one of said assemblies being provided with means for uniformly directing gas under pressure on said diaphragm which applies uniform pressure on said at least one chip retained by said template, and means for heating said substrate and/or at least one chip for bonding same together.

11. The pressure activated bonder of claim 10, wherein said first assembly includes means for aligning the substrate and template.

12. The pressure activated bonder of claim 10, wherein one of said assemblies includes a counter-sink section and an opening centrally located in said counter-sink section, said opening being adapted to be connected to a source of pressurized gas.

13. The pressure activated bonder of claim 10, additionally including means for providing said substrate with a controlled environment selected from the group consisting of gaseous atmosphere and vacuum conditions.

14. The pressure activated bonder of claim 13, wherein said means for providing gaseous atmosphere or vacuum conditions includes a plurality of passageways in said first assembly positioned to be in communication with said substrate, one of said passageways being adapted to be connected to one of the group consisting of a source of gas and a vacuum pump.

15. An apparatus for bonding a plurality of chips to a substrate having bonding material on either or both of the chips and the substrate, comprising:

a bottom block having two different area retaining sections therein, a smaller of said retaining sections being adapted to retain an associated substrate therein, a larger of said retaining sections being adapted to retain a template therein, said template being provided with openings of a least one size and adapted to retain therein associated chips;

a top block having an open section therein and an opening therein in fluid communication with said open section;

a diaphragm positioned intermediate said bottom and top blocks, and means for removably securing said diaphragm intermediate said bottom and top blocks.

16. The apparatus of claim 15, additionally including means for supplying high pressure gas to said top block.

17. The apparatus of claim 15, additionally including means for heating at least a portion of said bottom block.

18. The apparatus of claim 15, additionally including means for providing said bottom block with controlled environmental conditions.

19. The apparatus of claim 18, wherein said last-mentioned means includes a plurality of passageways in said bottom block and in communication with said smaller of said retaining sections in said bottom block.

20. The apparatus of claim 19, wherein one of said plurality of passageways is adapted to be connected to a gaseous source or a vacuum assembly.

21. An apparatus for bonding at least one chip to a substrate, comprising:

a base assembly, an alignment plate assembly, and a top plate assembly, said base assembly being provided with means adapted for retaining an associated substrate, said alignment plate assembly being provided with means adapted for retaining an associated chip, said base assembly also being provided with means for aligning an associated chip, and said top plate assembly including means for applying a pressure to an associated substrate.

22. The apparatus of claim 21, wherein said means for aligning includes means for adjusting the x-axis, the y-axis, and the theta-axis.

23. The apparatus of claim 21, wherein said means for applying a pressure includes a diaphragm.

24. A pressure activated bonder, comprising:

a first member, a second member, a diaphragm located adjacent said first and second members, means for supplying fluid pressure onto a surface of said diaphragm, means for retaining an associated first component to be bonded adjacent said diaphragm, and means for retaining at least another associated component to be bonded adjacent an associated first component to be bonded.

25. The pressure activated bonder of claim 24, wherein said associated first component to be bonded comprises a substrate, and wherein said at least another associated component to be bonded comprises at least one chip.

26. The pressure activated bonder of claim 24, wherein said means for supplying fluid pressure is operatively connected via said first member.

27. The pressure activated bonder of claim 24, wherein said means for supplying fluid pressure is operatively connected via said second member.

28. The pressure activated bonder of claim 24, additionally including means for heating associated components retained therein for bonding same together.

* * * * *